US008885422B2

(12) United States Patent
Ribeiro et al.

(10) Patent No.: US 8,885,422 B2
(45) Date of Patent: Nov. 11, 2014

(54) HIERARCHICAL ON-CHIP MEMORY

(75) Inventors: Gilberto Medeiros Ribeiro, Menlo Park, CA (US); R. Stanley Williams, Portola Valley, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 563 days.

(21) Appl. No.: 13/256,242

(22) PCT Filed: Jun. 12, 2009

(86) PCT No.: PCT/US2009/047253
§ 371 (c)(1),
(2), (4) Date: Sep. 13, 2011

(87) PCT Pub. No.: WO2010/144097
PCT Pub. Date: Dec. 16, 2010

(65) Prior Publication Data
US 2012/0005418 A1 Jan. 5, 2012

(51) Int. Cl.
G11C 7/00 (2006.01)
G11C 5/06 (2006.01)
G11C 5/02 (2006.01)

(52) U.S. Cl.
CPC . *G11C 5/02* (2013.01); *G11C 5/063* (2013.01)
USPC .............. 365/189.2; 365/189.17; 365/230.03

(58) Field of Classification Search
CPC ................................. G11C 5/063; G11C 5/02
USPC ............. 365/189.2, 189.17, 230.03; 711/103, 711/E12.008
See application file for complete search history.

(56) References Cited

U.S. PATENT DOCUMENTS

| 5,285,323 | A | 2/1994 | Hetherington et al. |
| 5,973,352 | A | 10/1999 | Noble |
| 6,381,140 | B1 | 4/2002 | Liao |
| 6,900,528 | B2 | 5/2005 | Mess et al. |
| 7,112,815 | B2 | 9/2006 | Prall |
| 7,157,305 | B2 | 1/2007 | Prall |
| 7,382,647 | B1 | 6/2008 | Gopalakrishnan |
| 7,583,526 | B2 * | 9/2009 | Bertin et al. ................. 365/151 |
| 2004/0160485 | A1 * | 8/2004 | Imanaka et al. ............... 347/58 |
| 2005/0167787 | A1 | 8/2005 | Fricke et al. |
| 2008/0192532 | A1 | 8/2008 | Segal |
| 2013/0106930 | A1 * | 5/2013 | Lea et al. ........................ 347/9 |

OTHER PUBLICATIONS

"Gear6 Web Cache"; Sales Brochure; http://www.gear6.com/sites/gear6.com/files/Gear6_Web_Cache_Datasheet.pdf.

(Continued)

*Primary Examiner* — Fernando Hidalgo

(57) ABSTRACT

A hierarchical on-chip memory (400) includes an area distributed CMOS layer (310) comprising input/output functionality and volatile memory and via array (325, 330), the area distributed CMOS layer (310) configured to selectively address the via array (325, 330). A crossbar memory (305) overlies the area distributed CMOS layer (310) and includes programmable crosspoint devices (315) which are uniquely accessed through the via array (325, 330). A method for utilizing hierarchical on-chip memory (400) includes storing frequently rewritten data in a volatile memory and storing data which is not frequently rewritten in a non-volatile memory (305), where the volatile memory is contained within an area distributed CMOS layer (310) and the non-volatile memory (305) is formed over and accessed through the area distributed CMOS layer (310).

15 Claims, 9 Drawing Sheets

(56) References Cited

OTHER PUBLICATIONS

Ozcan Ozturk, M.K.; "Multi-Level On-Chip Memory Hierarchy Design for Embedded Chip Multiprocessors"; Jul. 2006; The Twelfth International Conference on Parallel and Distributed Systems; http://www.gigascale.org/pubs/859/icpads06.pdf.

Lee, M.J., et al.; "Stack Friendly All-Oxide 3D RRAM using GaInZnO Peripheral TFT realized over Glass Substrates"; Dec. 2008; p. 1-4; IEEE; San Francisco; http://ieeexplore.ieee.org/xpt/freeabs_all.jsp?arnumber=4796620.

* cited by examiner

HIERARCHICAL ON-CHIP MEMORY

BACKGROUND

Data storage in computing systems rarely is a hardware representation of the most commonly utilized data structure. Data to be efficiently sought is organized in a hierarchical fashion, with most accessed portions closer than other, less frequently portions. In computing systems comprised of multiple types of memory devices with varying latency, rarely accessed items can be placed in less expensive, longer latency memory, and items more frequently accessed in more expensive, shorter latency memory. Hybrid integrated circuits implemented encompassing different memory technologies with different latencies can be efficiently used by proper mapping of the data structure in physical location in memory.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
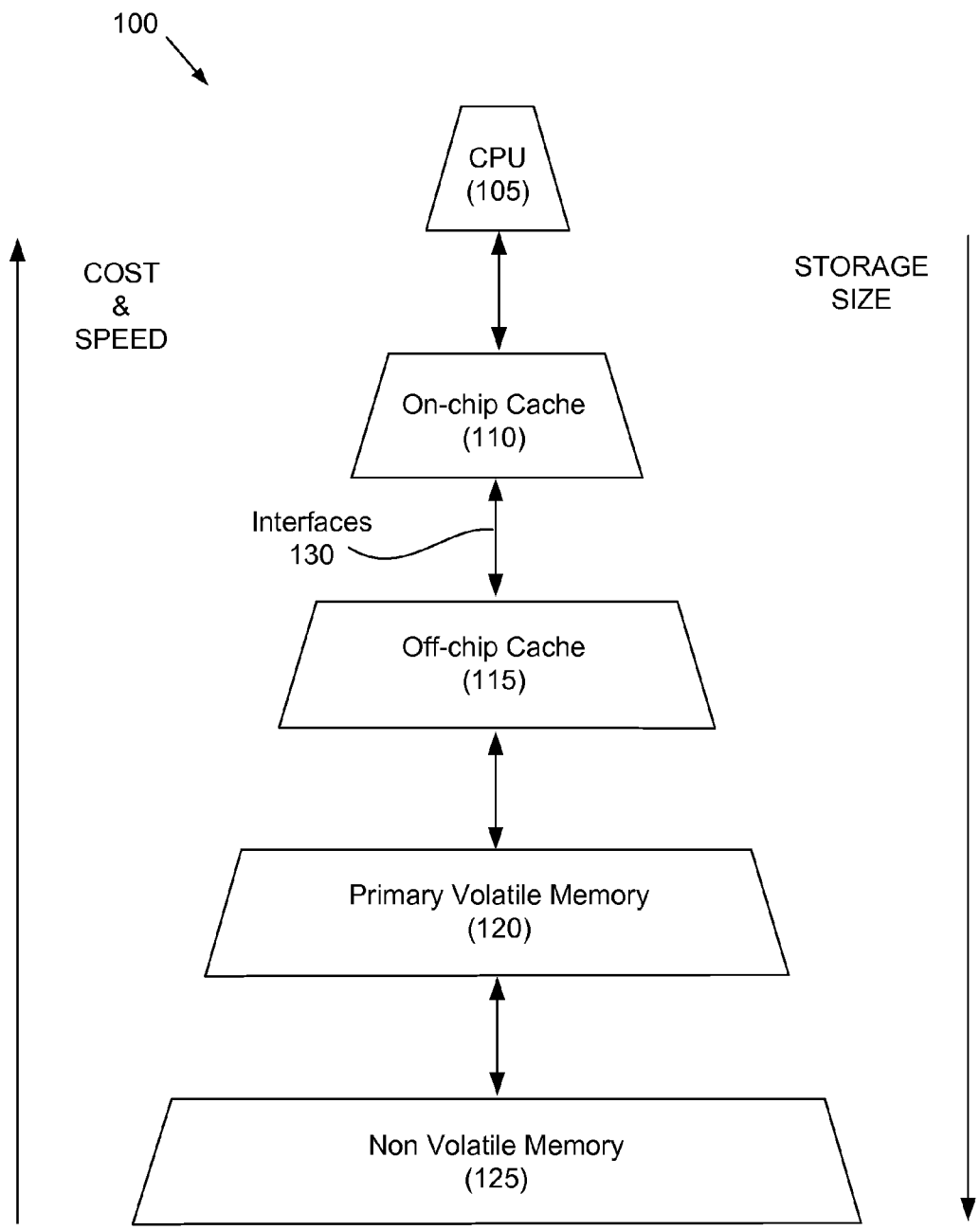
FIG. 1 is a diagram of an illustrative embodiment of a memory hierarchy within a computer system, according to one embodiment of principles described herein.

Computer equipment typically uses multiple types of memory devices to store and access data. These integrated memory circuits are distributed throughout the computer architecture. For example, on-chip cache may be included directly within a processor package, the primary volatile memory may be located in sockets on a motherboard, and a non-volatile memory (such as a hard drive) is typically mounted separately from the motherboard. Each of these memory types has advantages and weaknesses. By utilizing a combination the various memory types, the computer device can use each memory type to its best advantage while compensating for its weaknesses using another memory type. For example, the primary volatile memory may have very fast access times, but may be expensive, have limited capacity, and require a constant supply of power. In contrast, non-volatile memory such as a hard drive, may have longer access times, but has a large capacity, is relatively inexpensive, and can store data over long time scales without requiring power.

However, using various memory devices within the computer architecture imposes several burdens. The complexity and cost of the computer architecture can increase as additional memory types are added. In most cases, separate communication buses, protocols, and access techniques are used for each of the memory types. Further, the overall size of the computer typically increases as additional components are added.

The hierarchical on-chip memory described below integrates two or more different memory types into a single integrated circuit which is accessed through a common interface and circuitry. According to one illustrative embodiment, the hierarchical on-chip memory is a three dimensional multilayer circuit which includes a hybrid of Complimentary Metal Oxide Semiconductor (CMOS) memory circuitry and crossbar memory arrays. The CMOS memory circuitry provides a fast access memory which has a limited capacity, while the crossbar memory arrays provide non-volatile, inexpensive, large capacity memory. By way of example and not limitation, the CMOS memory circuitry include Dynamic Random Access Memory (DRAM) or its variations, Static Random Access Memory (SRAM), Flash memory or its derivatives, or other memory technologies. This multilayer circuit can be contained within a chip package which accessed through a single interface and combines the storage capacity of a hard drive with the fast access times of random access memory.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1 is a simplified diagram of one illustrative embodiment of a memory hierarchy (100) within a computer system. A memory hierarchy (100) can take a variety of forms and include a variety of interfaces (130). The interfaces (130) are indicated by double headed arrows and show connectivity between various components within the computer system. The illustrated interfaces (130) are not intended to be comprehensive or show the only data path through the memory hierarchy (100). The interfaces (130) may be different for each type of memory, or may share common elements with interfaces to other memories.

In one embodiment, the computer system includes a Central Processing Unit (CPU) (105) or other processor which executes software instructions. To execute these instructions, the CPU (105) is closely integrated with an on-chip cache (110). On-chip cache (110) is intended to represent a broad category of memory which resides on the same die or chip package as the CPU (110) such as CPU registers, on-die SRAM caches, etc. The on-chip cache (110) is typically a small capacity, fast access memory which stores data which most frequently accessed or is currently being operated on. When a CPU (105) needs to read from or write to a location in a main memory (120, 125), it first determines if there is a copy of that data in the on-chip cache (110). If so, the processor immediately reads from or writes to the on-chip cache (110), which is much faster than reading from or writing to other memory sources. As discussed above, the cache memory (110) is typically constructed from very fast and very expensive memory. Consequently, the cache memory (110) has limited size, but can respond very quickly to requests from the CPU (105).

Off-chip cache (115) is physically separated from the CPU (105), usually as a separate chip on the motherboard. This off-chip cache (115) can be significantly larger and less expensive than the on-chip cache (110). However, the off-chip cache (115) may have longer access latencies due to the slower interface and different memory types used in the off-chip cache (115).

The primary volatile memory (120) is typically random access memory (RAM) which can be much larger and less expensive than cache type memory. According to one embodiment, the primary volatile memory (120) is contained in a separate circuit board, such as a Dual In-line Memory Module (DIMM) which incorporates a series of dynamic RAM chips. These modules are typically mounted into connectors on the CPU motherboard and can be removed or replaced. The primary volatile memory (120) is slower than on-chip cache (110) and has longer read and write latencies. However, the primary volatile memory (120) is usually large enough to store current software instructions and frequently accessed data. For example, the primary volatile memory (120) may contain gigabytes of memory space.

Non-volatile memory (125) is very inexpensive, large capacity storage for data which is not frequently accessed. For example, when a computer starts a software program, the software instructions and associated data may be read from the non-volatile memory (125) into the primary volatile memory (120). The CPU then accesses the instructions and data through the primary volatile memory (120), without frequently writing or reading from the non-volatile memory. Types of non-volatile memory (125) may include hard disks, tapes, compact disks (CDs), digital video disks (DVDs), Non-volatile Random Access Memory (NVRAM), flash memory and other storage devices. The storage capacity of many non-volatile memories (120) can be in the terabyte range.

Typically, non-volatile memory (125) is configured to retain data over long periods of time. However, non-volatile memory (125) may only support a limited number of write cycles due to memory wear or other factors. For example, a given segment of flash memory can withstand around 100,000 write-erase cycles before the memory begins to deteriorate the integrity of the storage. Similarly, magnetic based non-volatile memory (125) such as hard drives and tape drives have limited lifetimes, with most failures resulting from mechanical damage to the medium or supporting mechanisms.

Another disadvantage of non-volatile memory may be its relatively long data access times. For example, when data is stored on a hard drive platter, the reading head must be physically repositioned over the location where the desired data is stored. Similarly, if the data is stored on magnetic tape, the tape must be wound to the location of the desired data. This physical reposition of the reading head or medium can require a significant amount of time compared to memories which do not rely on moving mechanisms.

As discussed above, a number of interfaces (130) and associated data buses are required to access the various memory types. In many cases separate busses and interfaces are used for each type of memory. This increases the cost and complexity of the computer system.

According to one illustrative embodiment, a crossbar memory array with programmable crosspoint devices can provide a highly compact nonvolatile storage medium which can be directly integrated over CMOS memory circuitry. The crossbar array memory can store large amounts of data in the same area as the underlying CMOS memory circuitry and can be accessed through the same interface. This can provide a number of advantages, including simplifying the interface between the processor and the memory, reducing the total chip count of the computer device, eliminating the need for conventional hard drives, lowering the cost of the computer device, result in a smaller computer device, and other advantages.

Figure 2:
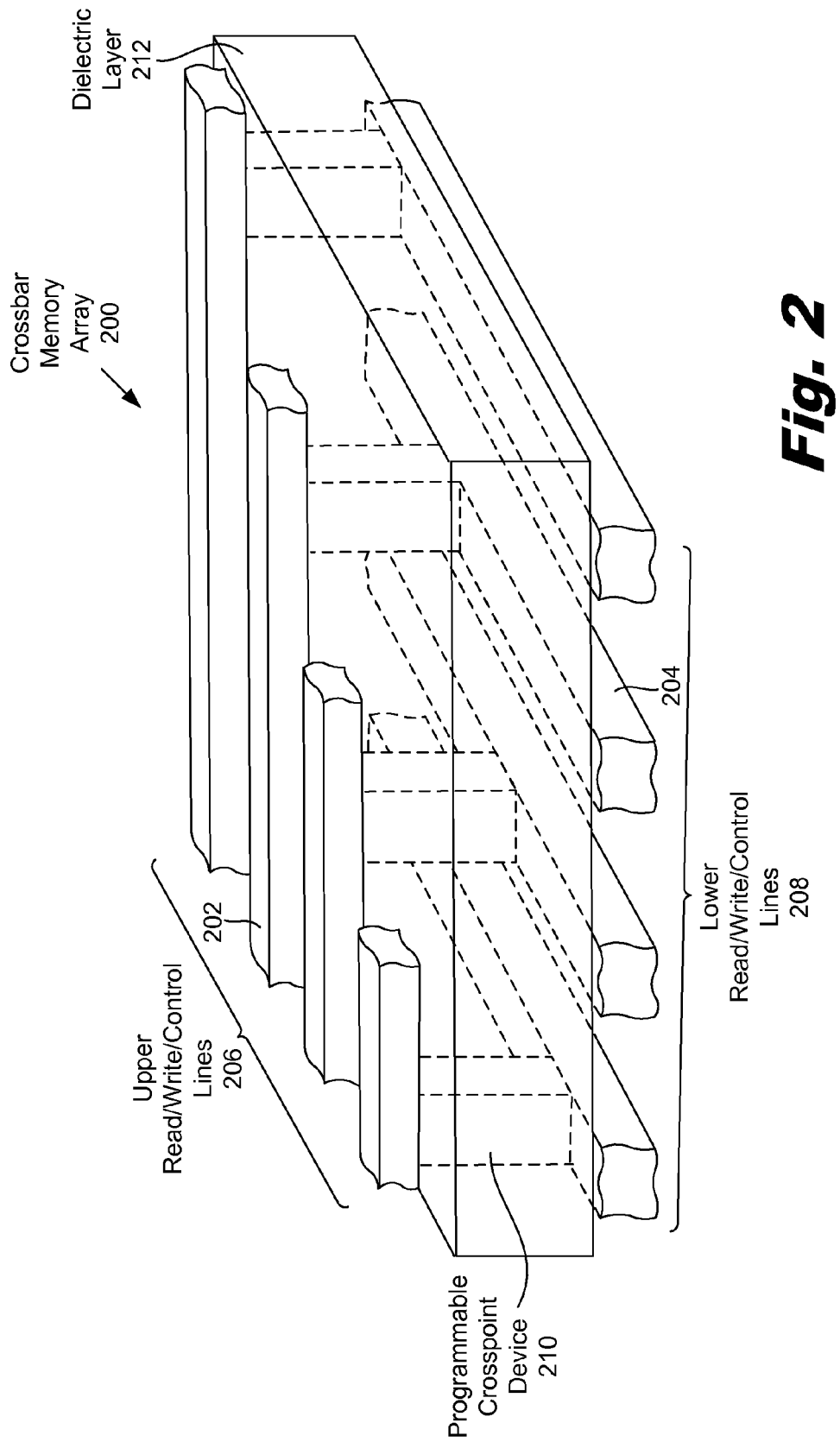
FIG. 2 is a perspective view of a crossbar memory array, according to one embodiment of principles described herein.

FIG. 2 is a perspective view of an illustrative crossbar array (200). The crossbar array (200) includes a first group of read/write/control lines (206) which are generally parallel. A second group of read/write/control lines (208) are illustrated as being perpendicular to the first group (205) and intersect the first group of lines (206). However, the two groups of lines (206, 208) may intersect each other at any nonzero angle.

Although individual nanowires (202, 204) in FIG. 2B are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers may be fabricated using a variety of techniques using any type of metal or highly conductive semiconducting material. For example, the nanowires may be fabricated by conventional photolithography as well as mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

According to one illustrative embodiment, programmable crosspoint devices (210) are formed between intersecting upper (206) and lower (208) lines. According to one illustrative embodiment, the programmable crosspoint devices (210) are memristive devices. Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants within the matrix. After removal of the electrical field, the location and characteristics of the dopants remain stable until the application of another programming electrical field. These changing dopant configurations within a matrix produce changes in the electrical resistance or other characteristics of the device.

The memristive device is read by applying a lower reading voltage which allows the internal electrical resistance of the memristive device to be sensed but does not generate a high enough electrical field to cause significant dopant motion. According to one illustrative embodiment, the memristive device exhibits a rectifying behavior similar to Schottky diode. The state of the memristive device can be read by applying a read stimulus (current or voltage) adjusted to maximize the bandwidth while minimizing the heat dissipation. According to one illustrative embodiment, the read stimulus is a forward voltage bias across specified junction while reverse biasing other memristive devices in the array to suppress leakage currents. These memristive crosspoint devices (210) may perform a variety of functions including providing programmable switching between the nanowires.

For example, in the simplest case, programmable crosspoint devices (210) may have two states: a conductive state and a nonconductive state. The conductive state may represent a binary "1" and the nonconductive state may represent a binary "0", or visa versa. Binary data can be written into the crossbar architecture (200) by changing the conductive state of the memristive crosspoint devices (210). The binary data can then be retrieved by sensing the state of the programmable crosspoint devices (210).

The example above is only one illustrative embodiment of a crossbar array (200). A variety of other configurations could be used. For example, the crossbar array (200) can incorporate memristive crosspoint devices (210) which have more than two states. In another example, crossbar architecture can be used to form implication logic structures and crossbar based adaptive circuits such as artificial neural networks. Other types of programmable crosspoint devices may include memcapacitive junctions, resistive random access memory (RRAM), magnetic random access memory (MRAM), and phase change random access memory (PCRAM) and other suitable devices.

In contrast to memories which require separate write and access lines, the crossbar array (200) uses the same lines (206, 208) for write and reading functions. Additionally, the programmable crosspoint devices (210) combine the functionality of conventional access devices (such as transistors) and conventional memory elements. By combining using the intersecting lines for both reading and writing and combining the functionality of an access device and a memory element into each of the programmable crosspoint devices (210), the crossbar array (200) can be less complex, less expensive, and occupy less planar area than the conventional memory arrays. This allows data densities which may be as great or greater than one terabyte per square centimeter. Consequently, a crossbar memory array (200) could replace conventional nonvolatile memory and occupy the same planar area as the faster volatile memory.

According to one illustrative embodiment, a crossbar memory array (200) may be integrated into complimentary metal-oxide-semiconductor (CMOS) or other conventional computer circuitry. This CMOS circuitry can provide additional functionality to the crossbar memory array (200) such as input/output functions, buffering, logic, or other functionality. The CMOS circuitry may also contain volatile memory such as DRAM.

Figure 3:
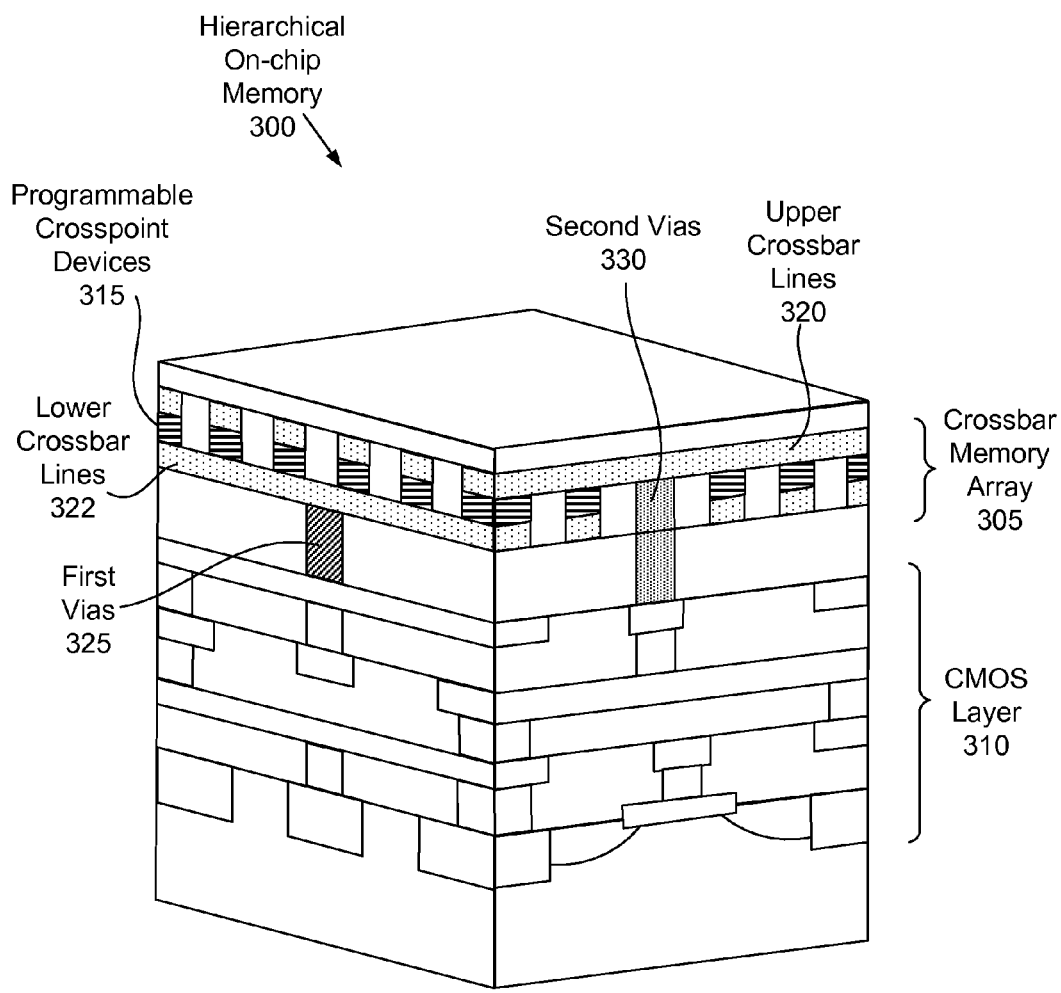
FIG. 3 is a diagram showing a cross-section of an illustrative hierarchical on-chip memory which includes a crossbar memory array and a complimentary metal-oxide-semiconductor (CMOS) layer, according to one embodiment of principles described herein.

FIG. 3 is a diagram showing an illustrative three dimensional multilayer circuit (300) which includes a CMOS layer (310) and an overlying crossbar array (305). In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry. Various three dimensional circuits which include integrated crossbar arrays are described in PCT Application No. PCT/US2009/039666, to Dmitri Strukov et al., entitled "Three Dimensional Multilayer Circuit," filed Apr. 6, 2009, which is incorporated by reference in its entirety.

As described above, the crossbar memory array includes a set of upper crossbar wires, a set of lower crossbar wires which intersect the upper crossbar wires at a non-zero angle, and programmable crosspoint devices interposed between the wires at the intersections. For example, the crossbar array (305) contains a set of upper crossbar wires (320), a set of lower crossbar wires (322), and a number of programmable crosspoint devices (315) interposed between the upper crossbar wires (320) and the lower crossbar wires (322). The crossbar array (305) is electrically connected to the underlying CMOS layer (310) by two groups of vias (325, 330). A first group of vias (325) connects to the lower crossbar lines (322) and a second group of vias (330) connects to the upper crossbar lines (320).

According to one illustrative embodiment, the CMOS layer (310) illustrated in FIG. 3 is "area distributed" rather than "peripherally distributed." Area distributed CMOS circuitry typically contacts the target circuitry over its bottom surface. The area distributed CMOS circuitry has several distinct advantages over contacting the target circuitry only around its periphery. In peripherally distributed CMOS circuitry, the density at which the CMOS circuitry can be packed around the target circuit can become a limiting factor in the circuit layout. Additionally, peripherally distributed CMOS circuitry can produce a combined circuit which occupies a large planar area, with long control and input/output lines. This leads to large values of line capacitance and resistance, which makes the write and read functions slow and energy intensive.

In contrast, area distributed CMOS circuitry typically underlies the target circuitry and can occupy as much room as the target circuit without increasing the required planar area of the combined circuit. Additionally, by connecting the CMOS circuitry to the overlying target circuit using vias, long connection traces are avoid. By avoiding long connection traces which are inherent in peripherally distributed configurations, the planar size and line capacitances of the circuit can be minimized. In particular, the nanowire length for area distributed interface is significantly reduced. This makes nanowire capacitance and resistance smaller, which makes write and read functions faster and lower energy, as well as reduces the number of devices connected to each nanowire thus decreasing possible leakage current.

According to one illustrative embodiment, the CMOS layer, in addition to containing volatile memory, includes input/output functionality such as addressing circuitry, multiplexers, demultiplexers, write circuitry, and readout circuitry.

For increased density and/or to decrease the planar size of the integrated circuit, additional crossbar arrays could be added above the first crossbar array (305). Connections are made between the various arrays and the CMOS circuit with vias. By interposing a lateral wiring layer between crossbars, it is possible to laterally shift the connecting point of a set of vias, thus enabling access to all connectivity domains in every crossbar array. This allows each programmable crosspoint device in each crossbar array to be uniquely addressed, without increasing the number of vias as the number of crossbar arrays in the circuit increases.

Figure 4:
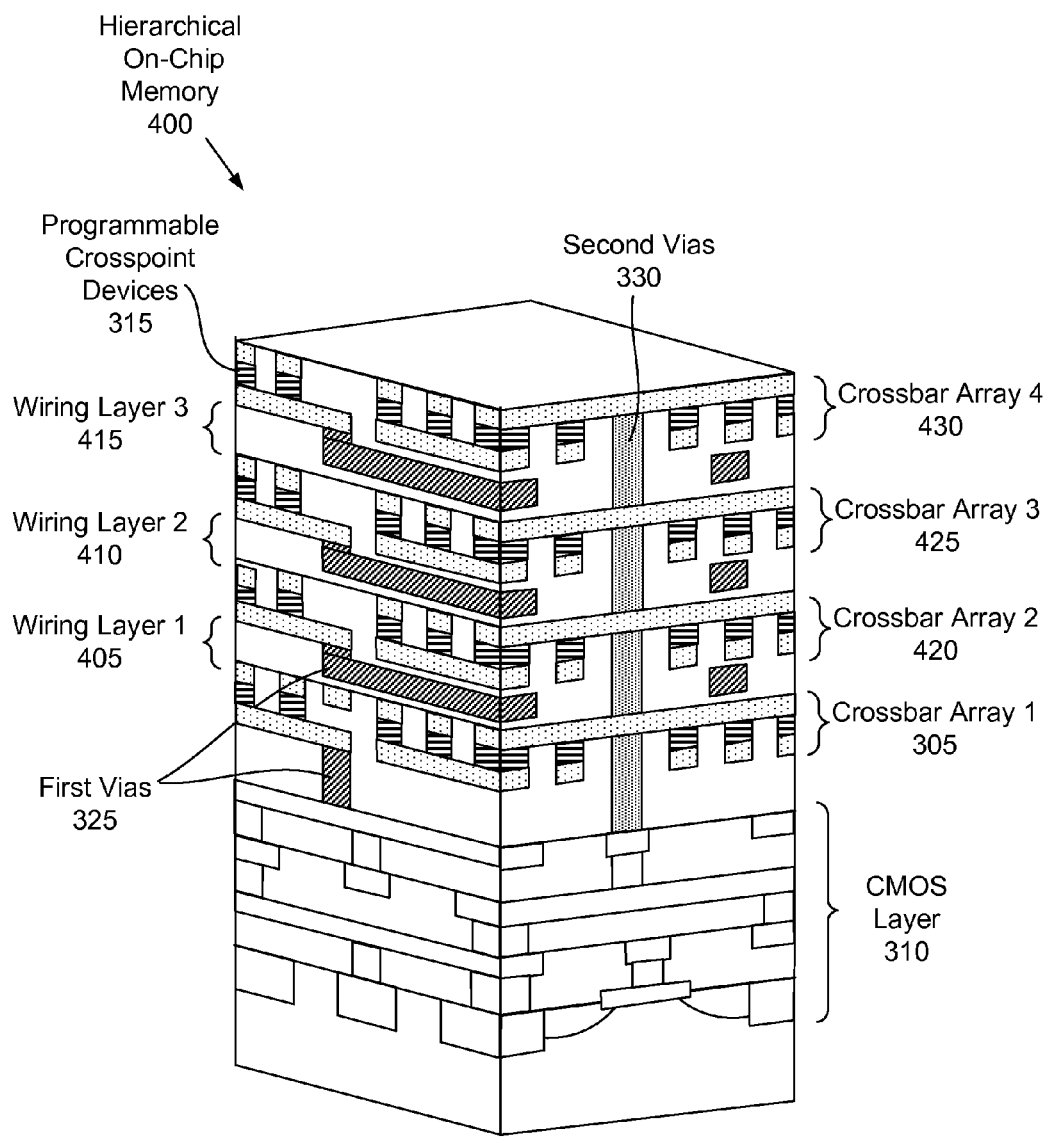
FIG. 4 is cross-sectional diagram of an illustrative hierarchical on-chip memory which includes a CMOS layer and multiple crossbar memory arrays, according to one embodiment of principles described herein.

FIG. 4 is cross-sectional diagram of an illustrative multilayer circuit (400) which includes a CMOS layer (310) and multiple crossbar memory arrays (305, 420, 425, 430). According to one illustrative embodiment, a number of wiring layers (405, 410, 415) are interposed between successive crossbar arrays (305, 420, 425, 430). The second vias (330) pass through all the crossbar arrays (305, 420, 425, 430) and wiring layers (405, 410, 415) as a vertical column. In contrast, the locations of the first vias (325) are shifted in each successive wiring layer (405, 410, 415). This allows a set of first vias (325) which participate in addressing programmable crosspoint devices (315) along a first upper crossbar segment (322, FIG. 3C) to be used in addressing a different set of programmable crosspoint devices in the overlying crossbar array.

As described above, the otherwise identical crossbar arrays are stacked upon each other using symmetry operations to enable fixed location vias to uniquely address every cell in each of the crossbar arrays. According to one illustrative embodiment, a first connectivity domain in a first crossbar array is offset by the wiring layer such that a second connectivity domain in a second crossbar array is adjacent to, but does not overlap, the first connectivity domain.

According to one illustrative embodiment, the programmable crosspoint devices (315) may be memristive junctions. Memristive junctions include a memristive matrix which is interposed between intersecting crossbar segments. The characteristics of these memristive junctions may vary between crossbar arrays. For example, a crossbar array 1 (305) may have memristive junctions with one particular matrix/dopant combination and crossbar array 2 (420) may have a different matrix/dopant combination.

Advantages of crossbar architectures which incorporate programmable crosspoint devices include simplicity of construction, high density as a result of minimum feature sizes, stable memory for extended period of time, and other advantages. Potential limitations of the crossbar memory arrays can be similar to other solid state, non-volatile memory devices. For example, in some embodiments the crossbar memory array may wear or degrade as a result of large numbers of erase/write cycles.

Figure 5:
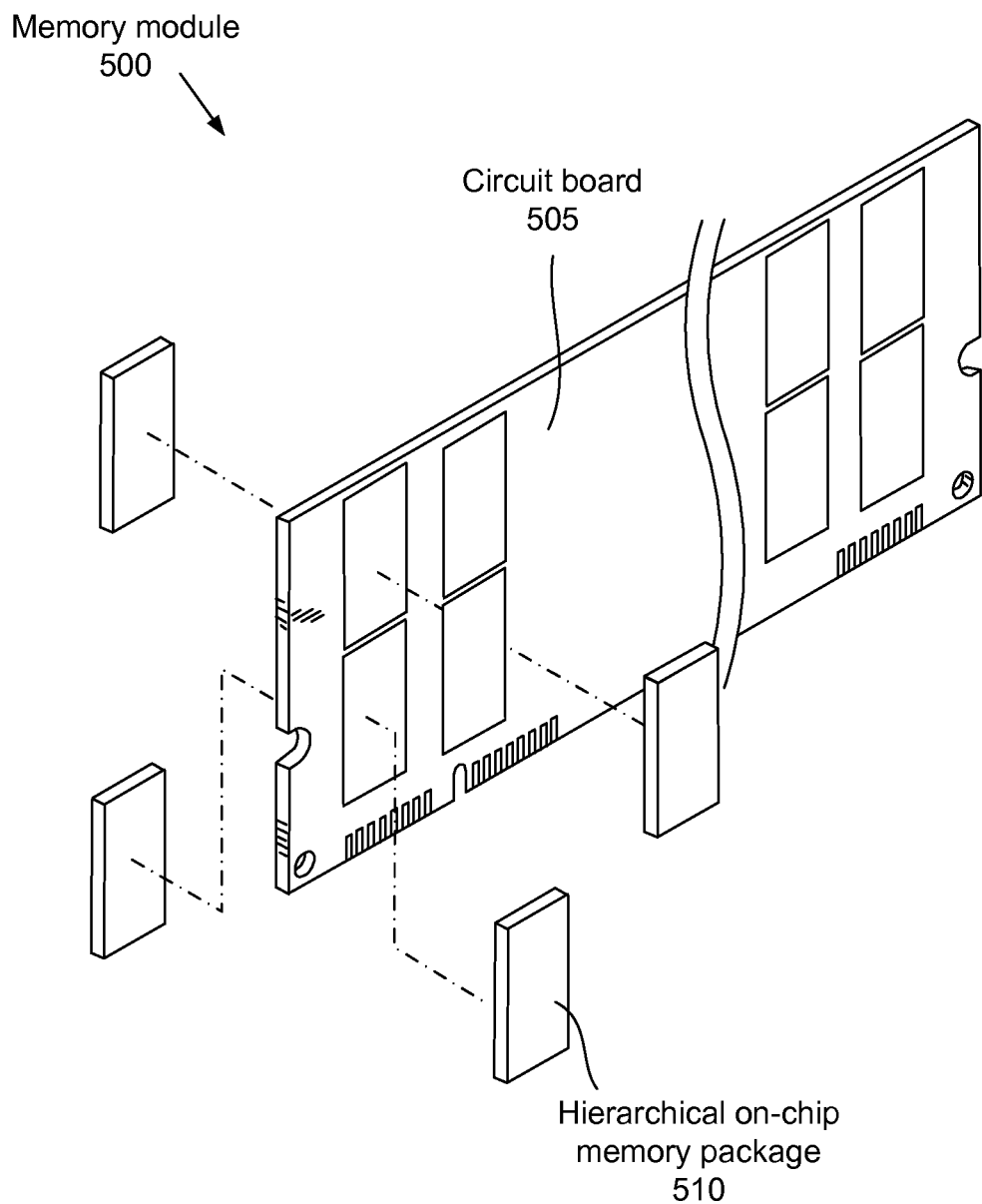
FIG. 5 is a perspective view of a memory module which includes chips which have hierarchical on-chip memory, according to one embodiment of principles described herein.

FIG. 5 is a perspective view of a memory module (500) which includes hierarchical on-chip memory packages (510) mounted on a circuit board (505). According to one illustrative embodiment, a plurality of memory packages (510) are mounted to a dual in-line memory module (DIMM) style circuit board (505). This is only one example of a memory module which could incorporate hierarchical on-chip memory packages (510). There are a variety of other embodiments, including, but not limited to, mounting the hierarchical on-chip memory packages (510) directly on a motherboard, using the memory packages (510) as a thumb drive, solid state drive, removable storage devices for cell phones, cameras, net book and other portable applications, or incorporating the hierarchical memory directly into a processor. Other applications may include replacing magnetic hard disks and other forms of permanent or semi-permanent storage of digital data; and/or a very high density cache. As discussed above, the hierarchical on-chip memory may combine the speed of volatile RAM with the capacity of a hard drive into a single package. Consequently, in some embodiments, one or more memory modules (500) may replace both the volatile (120, FIG. 1) and nonvolatile (125, FIG. 1) memories in a computing architecture.

Figure 6:
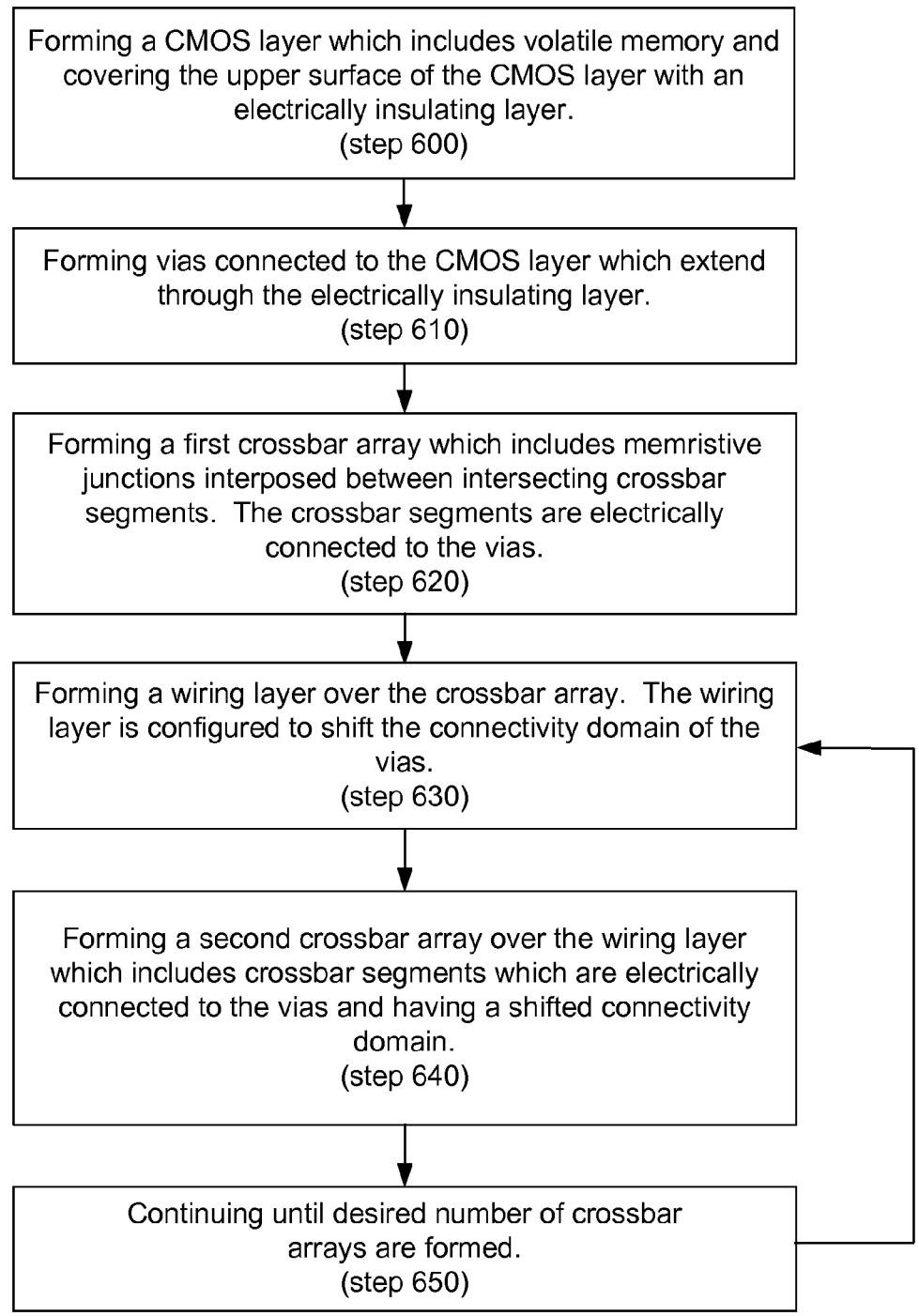
FIG. 6 is a flow chart describing one illustrative method for forming hierarchical on-chip memory, according to one embodiment of principles described herein.

FIG. 6 is a flow chart describing one illustrative method for forming hierarchical on-chip memory. According to one illustrative embodiment, the method includes forming a CMOS layer which includes volatile memory and covering the upper surface of the CMOS layer with a passivating/electrically insulating layer (step 600). A number of vias are connected to the CMOS layer and extend through the electrically insulating layer (step 610). These vias provide electrical access to the underlying CMOS layer. A first crossbar array is then formed. According to one illustrative embodiment, the crossbar array includes programmable crosspoint devices which are interposed between intersecting crossbar segments. These crossbar segments are electrically connected to the vias (step 620). A wiring layer is then formed over the first crossbar array. The wiring layer shifts the connectivity domain of the vias by offsetting a group of first vias while allowing a group of second vias to pass vertically through the wiring layer (step 630). A second crossbar array is formed over the wiring layer and the crossbar segments within the second crossbar array are electrically connected to the vias emerging from the wiring layer. This forms connectivity domains in the second crossbar array which are shifted with respect to the connectivity domains in the first crossbar array (step 640). This process can be repeated by continuing to form wiring layers and crossbar arrays until the desired circuit is formed (step 650).

Figure 7:
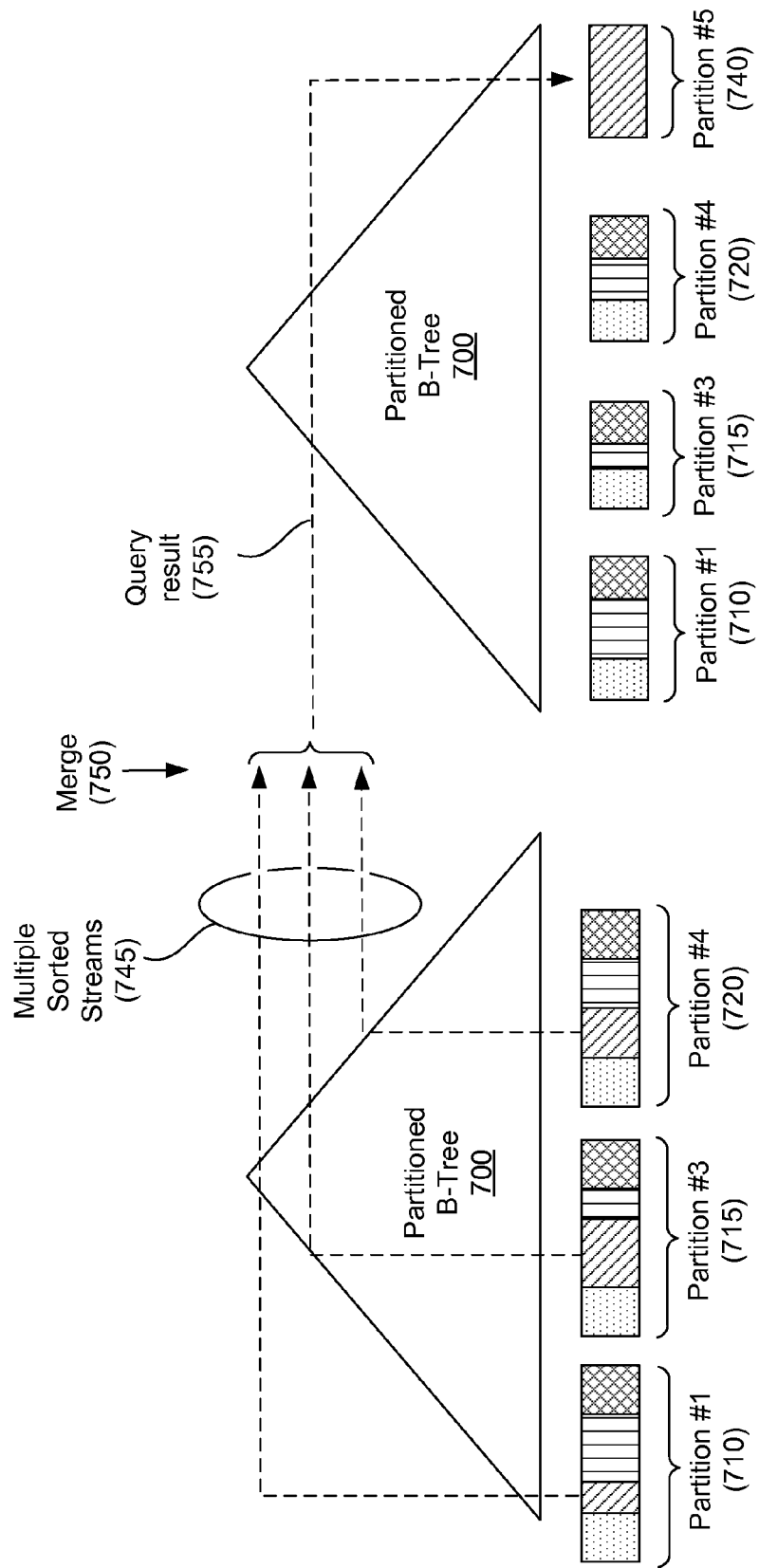
FIG. 7 is a diagram of an illustrative data management method which could be used in conjunction with hierarchical on-chip memory, according to one illustrative embodiment of principles described herein.

A variety of data management techniques are particularly well suited for use with hierarchical on-chip memory (400, FIG. 4). According to one illustrative embodiment, a partitioned B-tree architecture could be used to minimize the erase/write cycles of the crosspoint memory array, thereby extending the life of the hierarchical on-chip memory. FIG. 7 is a diagram of an illustrative partitioned B-tree method which could be used in conjunction with hierarchical on-chip memory. Partitioned B-trees and various adaptive merging techniques are described in U.S. application Ser. No. 12/433,418 to Goetz Graefe, entitled "Adaptive Merging in Database Indexes," filed Apr. 30, 2009, which is incorporated by reference in its entirety.

According to one illustrative embodiment, a partitioned B-tree includes an artificial leading key field which permits creation and removal of partitions by insertion and deletion of records with specific partition identifiers. The partitioned B-tree leverages data queries to segment frequently queried or accessed data into one or more separate partitions, while leaving data which is less frequently accessed distributed among various other partitions. This query based optimization manages the B-tree partitions by merging the key ranges required to answer actual queries, with no effort spent on any unused key ranges.

One advantage of a partitioned B-tree algorithm is that it separates and organizes data according to its actual usage. The left side of FIG. 7 shows the partitioned B-tree (700) when the query starts. In processing a query, records from the partitions (710, 717, 720) satisfying the query predicate create multiple sorted streams (745). The query predicate identifies key ranges within the partitions which are identified by a diagonally lined box within each partition. This data forms multiple sorted streams (745) that form a query result (755). The query result (755) is returned as the answer to the query.

Additionally, the individual sorted streams in query result (750) are merged and written into a new partition #5 (740). The data volume touched and moved is limited to the size of the query result. In this case the data volume indicated by the diagonally lined boxes can be copied or removed from partitions (710, 715, 720) and placed in the new partition #5 (740). Ideally, a single merge step suffices to merge records from all existing partitions into single new partition.

If the query range of a subsequent query is a subset of that of a prior query, the subsequent query can search the new partition (740) as efficiently in a partitioned B-tree as in a traditional B-tree. For example, if the subsequent query predicate was a subset of the query which generated partition #5 (740), the query would only require searching partition #5 (740). However, if the query ranges of the later queries do not overlap, it leaves its result behind in the same format as the second query for the benefit of the future queries. In this case, multiple queries can merge their output into the same new partitions.

Key ranges without query activity are never reorganized or merged. Those key ranges remain in the initial partitions runs produced by run generation. Consequently, no effort is wasted on inactive key ranges after the initial copy step. By adaptively merging only those key ranges actually queried, and by performing merge steps as side effects of query execution, adaptive merging in partitioned B-trees minimizes the number of copying or writing steps involved in optimizing the data base.

The partitioned B-tree algorithm described above can be particularly well suited for use in conjunction with hierarchical on-chip memory because it segments data into frequently rewritten data and data which is not frequently rewritten. According to one illustrative embodiment, the B-tree could be initially written in its entirety to the crossbar memory array, and then the B-tree could be searched in response to a query. The results of that query would be merged and written to a separate B-tree partition in the volatile memory of the hierarchical on-chip memory. This allows the frequently accessed and/or frequently modified data to be stored in volatile memory where it can be quickly read and manipulated without concern for erase/write wear. According to one illustrative embodiment, the results of the query would not be erased from the crossbar memory array unless necessary. Following the manipulation of this data, the new partition could be written or backed up to the crossbar memory for nonvolatile storage. A number of events could trigger the part or all of the data in volatile memory to be written into crossbar memory. For example, the data in the volatile memory could be written to the crossbar memory array when the application is closed, machine turned off, or for periodic backups. According to one illustrative embodiment, the number of erase/write cycles that the non-volatile memory is exposed to can be minimized using a de-duplication process. De-duplication prevents the rewriting of the whole memory or segment of the memory if only a few bits have changed. This can lead to faster updates and increased endurance.

The partitioned B-tree algorithm is only one illustrative embodiment of a data management technique which is particularly suited for use with hierarchical on-chip memory. A variety of other data management techniques could be used which divide data between the two memory types according to its frequency of usage. For example, data which is rewritten more frequently than a predetermined threshold is written into volatile memory and data which is written at or less frequently than the predetermined threshold is stored in non-volatile memory. Additionally or alternatively, a variety of other data management approaches could be used, include conventional data techniques for accessing and writing to hard drives and volatile RAM.

Figure 8:
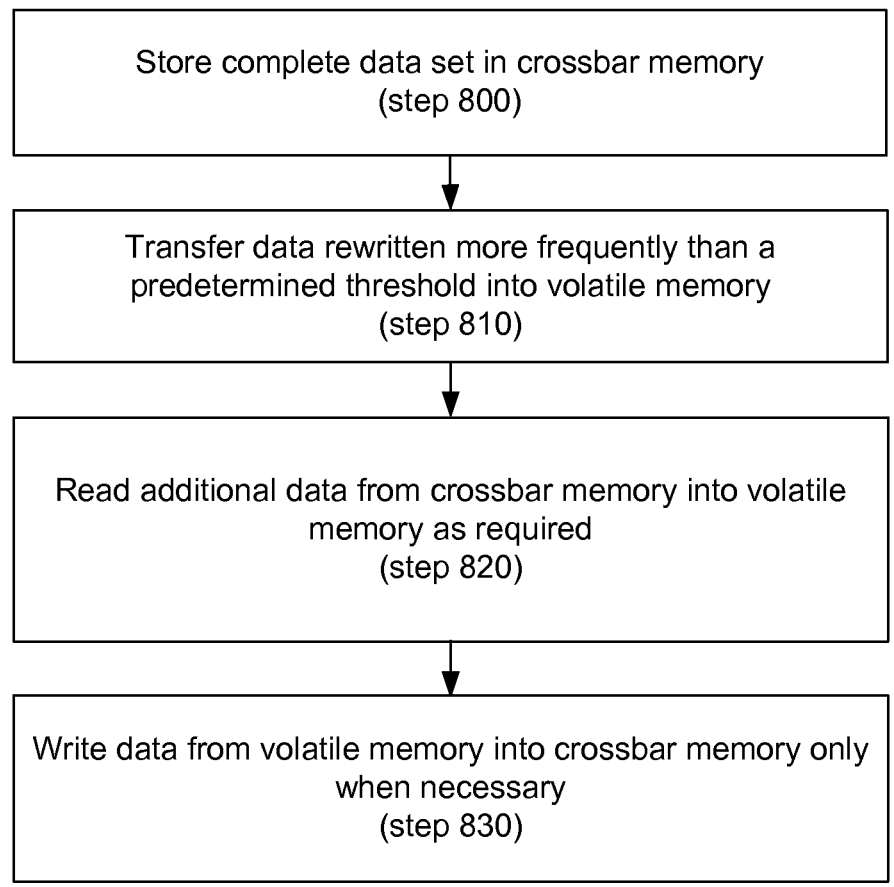
FIG. 8 is a flow chart of an illustrative method for managing data within a hierarchical on-chip memory, according to one illustrative embodiment of principles described herein.

FIG. 8 is a flow chart of an illustrative method for managing data within a hierarchical on-chip memory. According to one illustrative embodiment, the complete data set is stored in the crossbar memory (step 800). As discussed in the illustrative example above, the entire partitioned B-tree or other data structure could be loaded into the crossbar memory. Data which is rewritten more frequently than a predetermined threshold is transferred into volatile memory (step 810). For example, the query results made to a B-tree could be gathered from the crossbar memory, merged into a new partition, and stored in the volatile memory. This data would then be more quickly accessible and could be manipulated and rewritten within the volatile memory. Because the volatile memory has very little, if any wear caused by erase/rewrite cycles, no limitations on erase/rewriting of the data in the volatile memory would be required. Additional data can be retrieved from the crossbar memory as desired (step 820). As discussed above, reading data from the crossbar memory does not impose wear on the programmable crosspoint devices within the crosspoint memory. Data is then written from the volatile memory into the crossbar memory only when necessary (step 830). For example, data could be written to the crossbar memory as a periodic backup or when the power to the computer device was going to be turned off.

Figure 9:
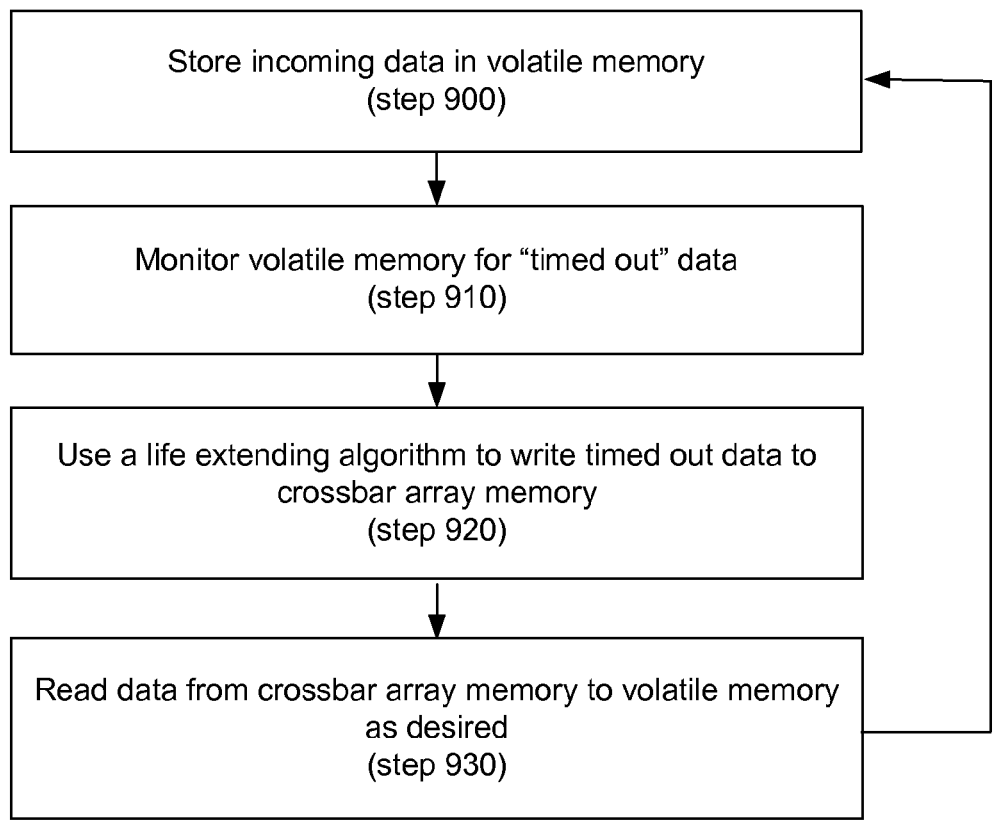
FIG. 9 is a flow chart of an illustrative method for managing data within a hierarchical on-chip memory, according to one illustrative embodiment of principles described herein.

FIG. 9 is a flow chart of an illustrative method for managing data within a hierarchical on-chip memory. In this illustrative embodiment, incoming data is stored volatile memory (step 900). This data is monitored for "timed out" data (step 910). According to one illustrative embodiment, timed out data could be data which has not been accessed for a given period of time. Additionally or alternatively, a predictive algorithm could be utilized which predicts the future use of various data segments. Those data segments which the predictive algorithm designates as "less likely to be altered such that the data must be rewritten" could be designated as timed out data. The timed out data is then written to the crossbar memory (step 920). Other illustrative embodiments for reducing the number of erase/write cycles of the non-volatile memory may include using a scoring system within a B-tree which predicts or tags data which is most often manipulated. Data with low scores could indicate that it is unlikely that the data will be manipulated and rewritten. Thus, this low score data could be efficiently stored in the non-volatile memory.

According to one illustrative embodiment, a preference is given to writing data which is not going to be changed or rewritten to the crossbar memory. For example, a reference data table which holds unchanging physical constants may efficiently stored in the crossbar memory array. Another example of data which could be efficiently stored in the crossbar memory array could be a directory of contact information. This information would change relatively slowly and making changes to the directory would induce minimal wear on crossbar memory array. In contrast, log files, file allocation tables, and other high accessed/modified parts of the file system could induce undesirable wear in the crossbar memory. These types of files could be stored in volatile memory until an event triggered the files to be backed up to crossbar memory.

In writing the timed out data to the crossbar memory (step 920), a life extending algorithm could be used to minimize the quantity and frequency of writes to the crossbar memory. According to one illustrative embodiment, the life extending algorithm could use a wear leveling techniques. Wear leveling techniques generally attempt to arrange data so that erasures and re-writes are distributed evenly across the medium. In this way, no single block of crossbar memory prematurely fails due to a high concentration of write cycles. In another embodiment of a life extending algorithm, several blocks or layers of crossbar memory could be reserved to replace blocks that have experience a high number of write cycles or fail. The life extending algorithm could then substitute these reserved blocks of memory to preserve the integrity of the crossbar memory. Additionally or alternatively, the life extending algorithm could include a change detection mechanism which identifies specific portions of the data which have changed. Only the changed data is then written to the crossbar memory, rather than complete blocks, programs, or the entire contents of the volatile memory. As discussed above, the crossbar memory does not typically experience appreciable wear during read operations; consequently data can be read from the crossbar memory into volatile memory as desired (step 930).

The data management techniques described above are not exclusive and can be combined, incorporated into other techniques, or replaced by other suitable techniques.

In sum, a hierarchical on-chip memory integrates two different memory types into a single integrated circuit which is accessed through a common interface and circuitry. According to one illustrative embodiment, hierarchical on-chip memory is a hybrid combines fast volatile memory with high density, non-volatile memory. For example, the hierarchical on-chip memory may combine CMOS based memory circuitry and crossbar memory arrays. According to one illustrative embodiment, multiple crossbar memory arrays are vertically integrated on top of the CMOS layer. The entire hierarchical on-chip memory can be accessed through a single interface using the CMOS layer's addressing circuitry.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A hierarchical on-chip memory comprising:
    an area distributed CMOS layer comprising input/output functionality and volatile memory;
    a via array, the area distributed CMOS layer configured to selectively address the via array; and
    a crossbar memory configured to overlie the area distributed CMOS layer, the crossbar memory comprising programmable crosspoint devices which are uniquely accessed through the via array.

2. The hierarchical on-chip memory according to claim 1, in which a number of vias in the via array does not increase as a number of crossbar arrays in the hierarchical on-chip memory increases, in which connectivity domains in each of the crossbar arrays are unique.

3. The hierarchical on-chip memory according to claim 1, in which otherwise identical crossbar arrays are stacked upon each other using symmetry operations to enable fixed location vias to uniquely address every programmable crosspoint device in each of the crossbar arrays.

4. The hierarchical on-chip memory of according to claim 1, further comprising an interposed wiring layer configured to offset a connectivity domain of the set of first vias between successive crossbar arrays.

5. The hierarchical on-chip memory according to claim 4, in which a first connectivity domain in a first crossbar array is offset by the wiring layer such that a second connectivity domain in a second crossbar array is adjacent to, but does not overlap, the first connectivity domain.

6. The hierarchical on-chip memory of according to claim 1, in which the programmable crosspoint devices are one of memristive junctions and memcapacitive junctions.

7. A method for utilizing hierarchical on-chip memory comprises:
    storing data rewritten more frequently than a first predetermined threshold in a volatile memory; and
    storing data rewritten at or less frequently than a second predetermined threshold in a non-volatile memory;
    in which the volatile memory is contained within an area distributed CMOS layer and the non-volatile memory being formed over and accessed through the area distributed CMOS layer.

8. The method according to claim 7, in which a division of the frequently rewritten data and data which is not frequently rewritten is made using a partitioned B-tree algorithm.

9. The method according to claim 8, further comprising:
    storing B-tree data in the non-volatile memory array;
    searching the B-tree data in the non-volatile memory array in response to a query;
    merging query results and writing the merged query results into a separate B-tree partition; and
    storing the separate B-tree partition in the volatile memory.

10. The method according to claim 7, further comprising:
    storing a complete data set in the non-volatile memory;
    transferring frequently accessed data into volatile memory;
    reading additional data from the non-volatile memory into the volatile memory to support processor operations; and
    minimizing the writing of data from the volatile memory to the non-volatile memory.

11. The method according to claim 7, further comprising:
    storing incoming data in volatile memory;
    monitoring volatile memory for timed out data;
    using a life extending algorithm to write timed out data to the non-volatile memory;
    reading data from the non-volatile memory into the volatile memory to support processor operations.

12. The method according to claim 11, in which the life extending algorithm comprises a wear leveling algorithm.

13. The method according to claim 12, in which the life extending algorithm comprises at least one of substituting reserve blocks of memory for blocks of memory with high wear and writing only data which changed to the non-volatile memory.

14. The method according to claim 7, in which the non-volatile memory comprises a crossbar memory.

15. The method according to claim 14, in which the crossbar memory array comprises at least one of memristive crosspoint memory elements and memcapacitive crosspoint memory elements.

* * * * *

UNITED STATES PATENT AND TRADEMARK OFFICE
CERTIFICATE OF CORRECTION

PATENT NO. : 8,885,422 B2  Page 1 of 1
APPLICATION NO. : 13/256242
DATED : November 11, 2014
INVENTOR(S) : Gilberto Medeiros Ribeiro et al.

It is certified that error appears in the above-identified patent and that said Letters Patent is hereby corrected as shown below:

In the Claims

In column 11, line 53 approx., in Claim 4, delete "of according" and insert -- according --, therefor.

In column 12, line 6, in Claim 6, delete "of according" and insert -- according --, therefor.

Signed and Sealed this
Twenty-sixth Day of May, 2015

Michelle K. Lee
*Director of the United States Patent and Trademark Office*